(12) United States Patent
Yun et al.

(10) Patent No.: US 8,125,061 B2
(45) Date of Patent: Feb. 28, 2012

(54) SEMICONDUCTOR PACKAGE AND METHOD OF MANUFACTURING THE SAME

(75) Inventors: Yeon-Sun Yun, Paju-Si (KR); Seok-Bong Kim, Paju-Si (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 218 days.

(21) Appl. No.: 12/553,628

(22) Filed: Sep. 3, 2009

(65) Prior Publication Data
US 2011/0049686 A1   Mar. 3, 2011

(51) Int. Cl.
*H01L 23/495* (2006.01)
*H01L 23/00* (2006.01)
(52) U.S. Cl. ............... 257/666; 257/778; 257/E23.001
(58) Field of Classification Search .......... 257/660, 257/666, 531, E23.001, 737, 738, 778
See application file for complete search history.

(56) References Cited

U.S. PATENT DOCUMENTS

| 6,614,102 B1 * | 9/2003 | Hoffman et al. .......... 257/666 |
| 6,707,168 B1 | 3/2004 | Hoffman et al. |
| 2006/0285480 A1 | 12/2006 | Janofsky |

FOREIGN PATENT DOCUMENTS
CN   1885850 A   12/2006

* cited by examiner

*Primary Examiner* — Roy Potter
(74) *Attorney, Agent, or Firm* — Muncy, Geissler, Olds & Lowe, PLLC

(57) ABSTRACT

A semiconductor package is provided. The semiconductor package includes a carrier, a die, a metal sheet and a molding compound. The die is disposed on the carrier. The metal sheet has a first portion and a second portion, wherein a receiving space is defined by the first portion and the second portion, and the second portion is electrically connected to the carrier. The molding compound covers the die and the receiving space is filled by at least part of the molding compound.

20 Claims, 5 Drawing Sheets

SEMICONDUCTOR PACKAGE AND METHOD OF MANUFACTURING THE SAME

BACKGROUND OF THE INVENTION

1. Field of the Invention

The invention relates in general to a semiconductor package and a method of manufacturing the same, and more particularly to a semiconductor package having a molding compound to cover a die and a method of manufacturing the same.

2. Description of the Related Art

Along with the development of semiconductor technology, a semiconductor package having a small size has been highly emphasized. Generally speaking, shrinking the size of the semiconductor package is the current trend. However, as more and more components are disposed on a substrate of the semiconductor package to provide multi-functions, the size of the semiconductor package is hard to be reduced.

Take a semiconductor package having a substrate disposed with an inductor thereon for an example. In order to have higher inductance value, the size of the inductor has to be larger. As a result, more space of the substrate is occupied, hence increasing the size of the semiconductor package correspondingly.

Therefore, how to shrink the size of the semiconductor package is one of main topics for related manufactures.

SUMMARY OF THE INVENTION

The invention is directed to a semiconductor package and a method of manufacturing the same which has the advantage of reducing the size of the semiconductor package and the cost of the semiconductor package.

According to an aspect of the present invention, a semiconductor package is provided. The semiconductor package includes a carrier, a die, a metal sheet and a molding compound. The die is disposed on the carrier. The metal sheet has a first portion and a second portion, wherein a receiving space is defined by the first portion and the second portion, and the second portion is electrically connected to the carrier. The molding compound covers the die and the receiving space is filled by at least part of the molding compound.

According to another aspect of the present invention, a method of manufacturing a semiconductor package includes: forming a metal sheet having a first portion and a second portion, wherein a receiving space is defined by the first portion and the second portion; disposing the metal sheet on a carrier having a die disposed thereon and electrically connecting the second portion to the carrier; and forming a molding compound to cover the die and fill the receiving space.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1A:
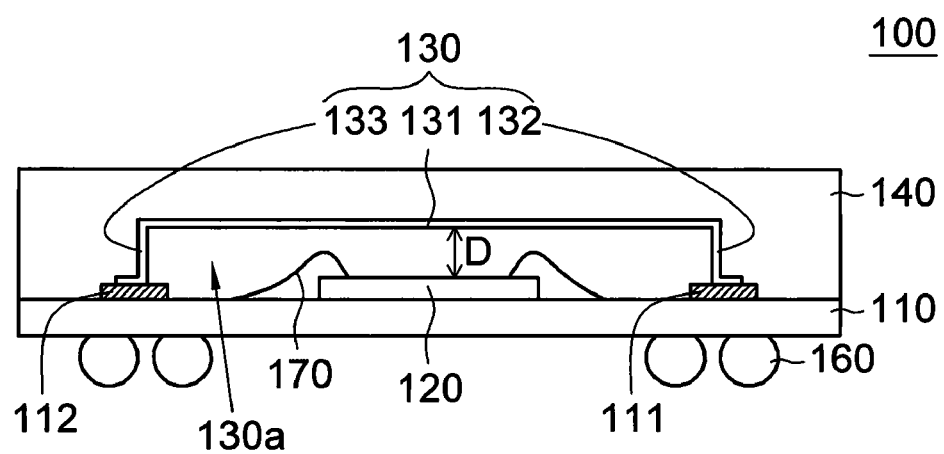
FIG. 1A shows a semiconductor package according to a first embodiment of the present invention.
Figure 1B:
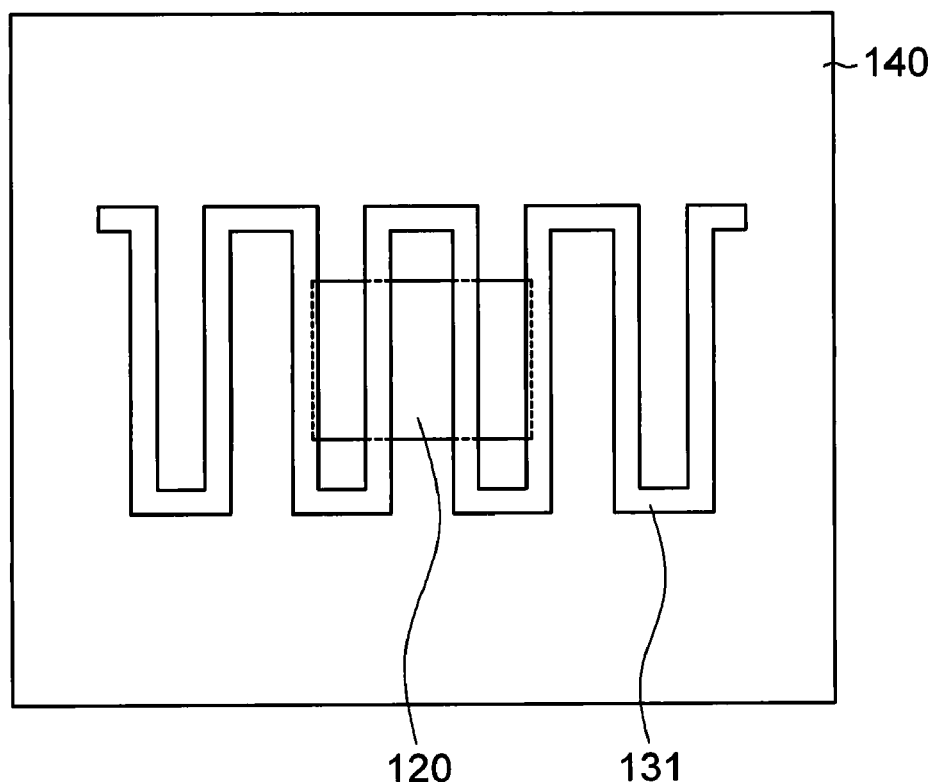
FIG. 1B shows a top view of the semiconductor package in FIG. 1A.

Referring to FIG. 1A and FIG. 1B, a semiconductor package according to a first embodiment of the present invention is shown in FIG. 1A, and a top view of the semiconductor package in FIG. 1A is shown in FIG. 1B. The semiconductor package 100 includes a carrier 110, a die 120, a metal sheet 130 and a molding compound 140. The die 120 is disposed on the carrier 110. The metal sheet 130 has a first portion 131 and a second portion 132. A receiving space 130a is defined by the first portion 131 and the second portion 132, and the second portion 132 is electrically connected to the carrier 110. The molding compound 140 covers the die 120 and the receiving space 130a is filled by at least part of the molding compound 140.

The semiconductor package 100 will be further elaborated in the following. In the present embodiment of the invention, the metal sheet 130 further has a third portion 133, by which the receiving space 130a is further defined. The receiving space 130a is filled by the molding compound 140, and the molding compound 140 covers the metal sheet 130, so that the metal sheet 130 is embedded into the molding compound 140. As the molding compound 140 is formed to protect the die 120, the metal sheet 130 embedded in the molding compound 140 only needs the space for the pads 111 and 112, by which the second portion 132 and the third portion 133 are electrically connected to the carrier 110.

Moreover, the metal sheet 130 can function as a component, for example, an inductor, to replace the component wholly disposed on the surface of the carrier 110. Take the metal sheet 130 as an inductor for an example. If an inductor with a higher inductance value is needed, the size of the metal sheet 130 embedded in the molding compound 140 can be increased without occupying additional space of the carrier 110. As a result, the integration of the semiconductor package 100 can be increased so as to shrink the size of the semiconductor package 100.

Figure 2A:
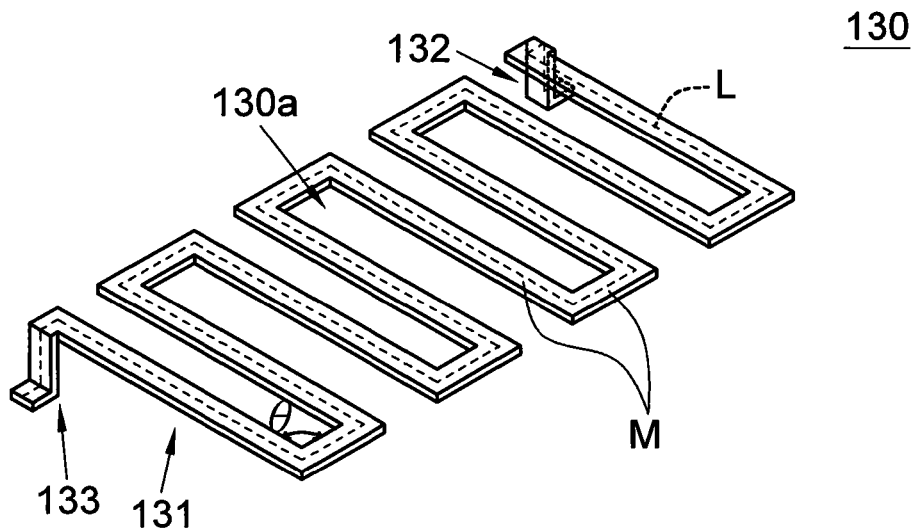
FIG. 2A shows a perspective view of the metal sheet in FIG. 1.

Referring to FIG. 2A, a perspective view of the metal sheet in FIG. 1 is shown. The first portion 131 is substantially perpendicular to the second portion 132 and the third portion 133 to define the receiving space 130a. The first portion 131 has several metal bars M. The metal bars M are substantially coplanar. An angle θ between the two adjacent metal bars M is smaller than 180 degrees, for example, about 90 degrees. In this example shown in FIG. 1B and FIG. 2A, the metal bars M form an S-shaped structure. If the length L of the metal sheet 130 needs to be increased to increase the inductance value, more metal bars M can be used without increasing the space of the carrier 110 occupied for the metal sheet 130, that is, the space for the pads 111 and 112.

One end of the second portion 132 and one end of the third portion 133 are connected to the pads 111 and 112, respectively, so that the metal sheet 130 is electrically connected to the carrier 110. In the present embodiment of the invention, a surface treatment can be applied on the pads 111 and 112 according to the type of the carrier 110 so as to improve surface properties. For example, when the carrier 110 is a leadframe, a surface of each of the pads 111 and 112 can be coated with silver. Or, when the carrier 110 is a substrate, the surface of each of the pads 111 and 112 can be coated with nickel/gold.

Figure 2B:
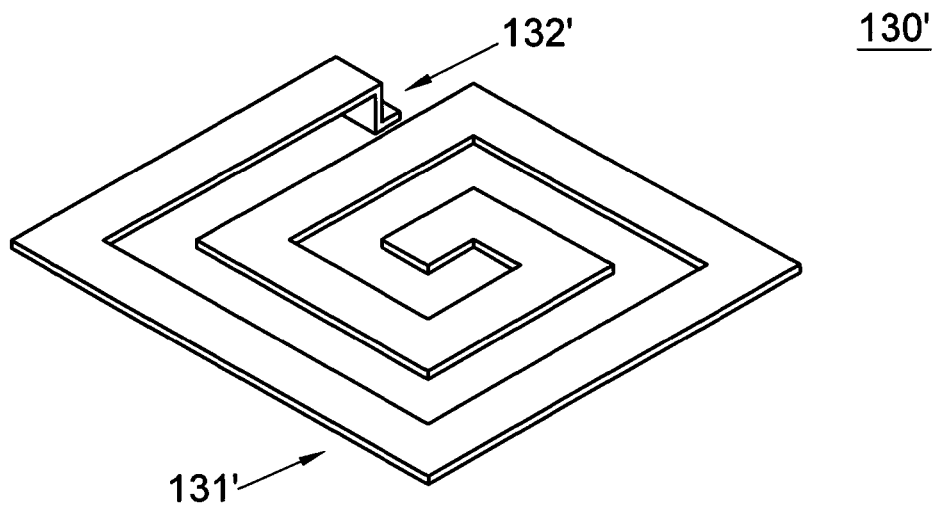
FIGS. 2B and 2C show examples of metal sheets with different shapes.
Figure 2C:
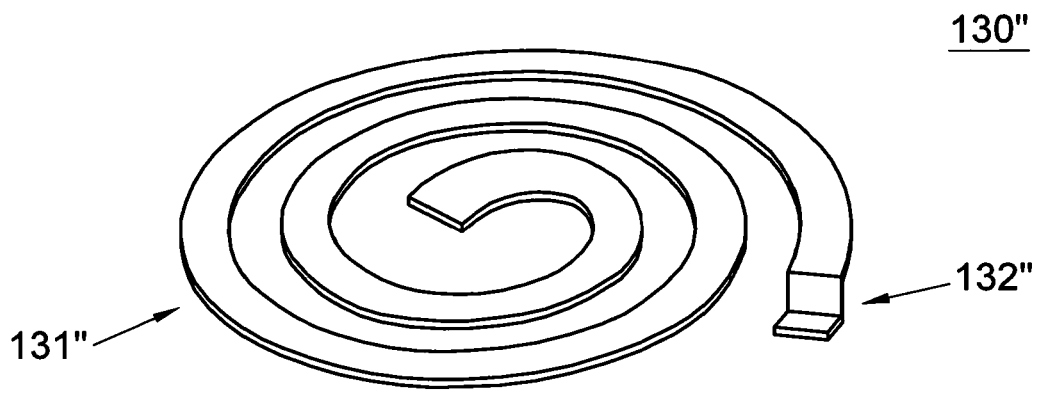

The metal sheet 130 having the first portion 131 and the second portion 132 can be formed in other shapes. Referring to FIGS. 2B and 2C, examples of metal sheets with different shapes are shown. In both FIGS. 2B and 2C, the first portions 131' and 131" are spiral metal bars. More specifically, in FIG. 2B, the metal sheet 130' has the first portion 131' being a spiral square and a second portion 132' with one end shaped for being contacted to the pad. In FIG. 2C, the metal sheet 130" has the first portion 131" being a spiral circle and a second portion 132" with one end shaped for being contacted to the pad. The metal sheets 130' and 130" can function as a component, such as an antenna. When the metal sheet 130' having the second portion 132' is intended to be electrically connected to the carrier 110, only one pad is needed to be disposed on the carrier 110 for being connected to the end of the second portion 132'. If the metal sheets 130' and 130" is intended to function as an inductor, third portions (not shown) are needed for the metal sheets 130' and 130" and two pads on the carrier are needed.

Moreover, in the present embodiment of the invention, the first portion 131 is located above the die 120. Generally, the die 120 and the carrier 110 are electrically connected to each other through wires 170. The peak of each wire 170 is closer to the first portion 131. In order to avoid the peak of each wire 170 touching the first portion 131, a distance D between the first portion 131 and a top surface of the die 120 should be designed. For example, the distance D is preferably greater than 4 mil.

Furthermore, in order to be electrically connected to other substrate, the semiconductor package 100 can further include several solder balls 160 disposed on a bottom of the carrier 110.

In the embodiment of the present invention, the semiconductor package 100 can be manufacturing by a method including the following steps. Referring to FIGS. 3A~3F, a method of manufacturing the semiconductor package 100 in FIG. 1 is shown.

Figure 3A:
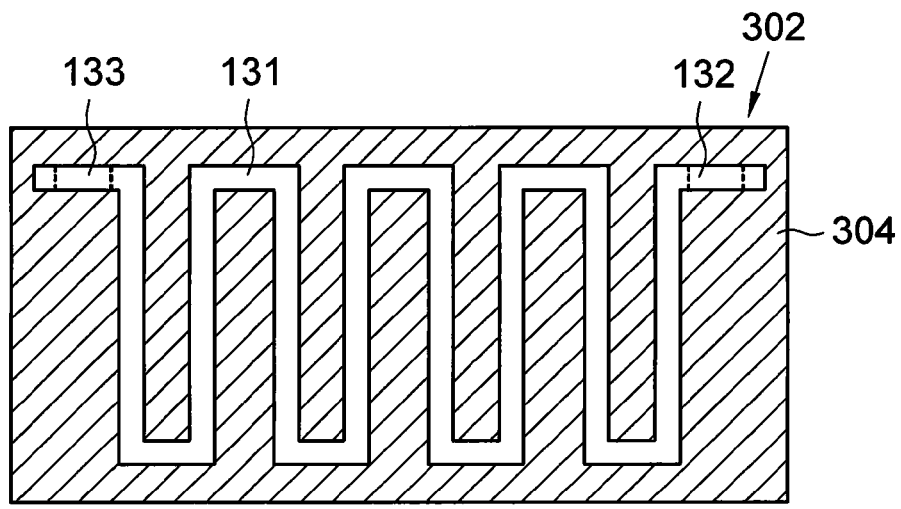
FIGS. 3A~3F show a method of manufacturing the semiconductor package in FIG. 1.
Figure 3B:
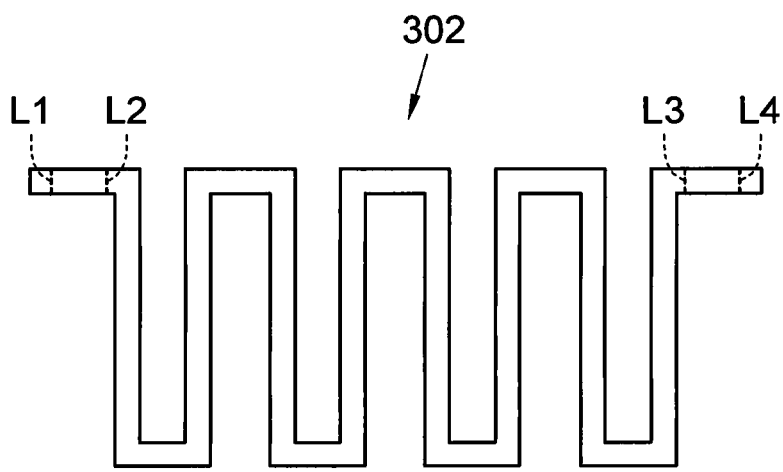
Figure 3C:
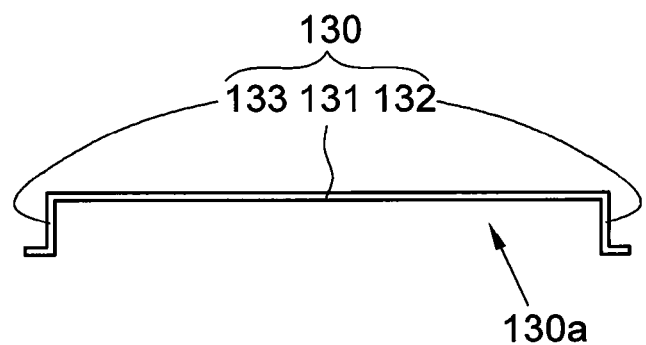

First, the metal sheet 130 having the first portion 131 and the second portion 132 is formed. The receiving space 130a is defined by the first portion 131 and the second portion 132. The metal sheet 130 can be formed by the following steps. Referring to FIG. 3A, a top view of a metal plate 302 is shown. First, part 304 of a metal plate 302 is removed to form the first portion 131, the second portion 132, and the third portion 133. Then, as shown in FIG. 3B, the metal plate 302 is bent along lines L1 to L4 so that the receiving space 130a defined by the first portion 131, the second portion 132, and the third portion 133 is formed, so as to form the metal sheet 130 whose side view is shown in FIG. 3C. The step of removing the part of the metal plate can be, for example, performed by etching or dry etching.

Figure 3D:
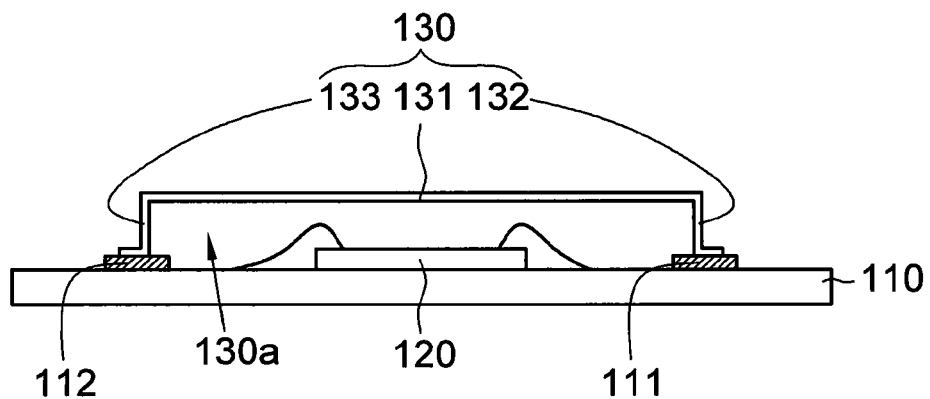

Next, as shown in FIG. 3D, the metal sheet 130 is disposed on the carrier 110 having the die 120 disposed thereon and the second portion 132 is electrically connected to the carrier 110. In the present embodiment of the invention, the first portion 131 is disposed above the die 120. The metal sheet 130 is disposed to connect the ends of the second portion 132 and the third portion 133 to the pads 111 and 112, respectively.

Figure 3E:
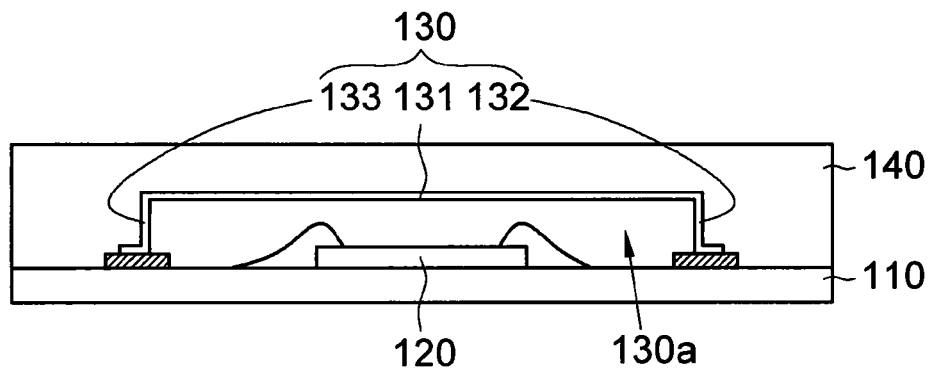

After that, as shown in FIG. 3E, the molding compound 140 is formed to cover the die 120 and fill the receiving space 130a. In the step of forming the molding compound 140, the molding compound 140 can be formed to cover the metal sheet 130 so as to embed the metal sheet 130 into the molding compound 140 to save space of the carrier 110.

Figure 3F:
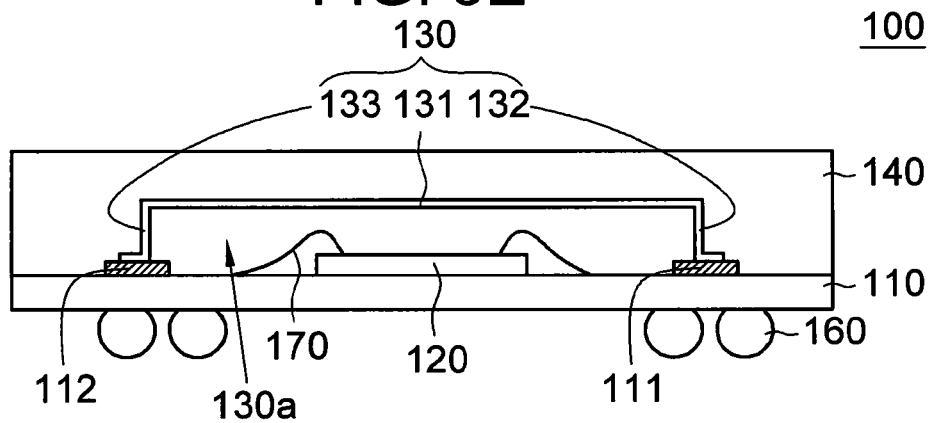

Preferably, as shown in FIG. 3F, the method of manufacturing the semiconductor package 100 further includes the step of disposing the solder balls 160 on the bottom of the carrier 110. Therefore, the semiconductor package 100 can be electrically connected to other substrates through the solder balls 160.

In another example of a semiconductor package, the third portion 133 can be omitted based on the function of the metal sheet 130. For example, if the metal sheet 130 is intended to function as an antenna, the third portion 133 can be omitted, and only one pad 112 on the carrier 110 is needed. In further another example, the metal sheet 130 can be exposed from the molding compound 140.

Second Embodiment

Figure 4:
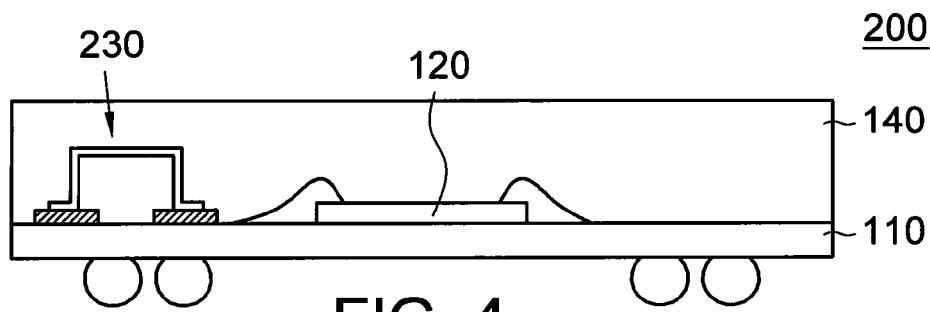
FIG. 4 shows a semiconductor package according to a second embodiment of the present invention.

Referring to FIG. 4, a semiconductor package according to a second embodiment of the present invention is shown. The semiconductor package 200 includes a carrier 110, a die 120, a metal sheet 230 and a molding compound 140. Compared to the semiconductor package 100 according to the first embodiment, the metal sheet 230 of the semiconductor package 200 is disposed on the carrier 110 and beside the die 120. Therefore, the semiconductor package 200 can also achieve the similar advantages of the semiconductor package 100.

In addition, compared to the steps of the method of manufacturing the semiconductor package 100, the step of disposing the metal sheet 230 according to the second embodiment is different. More specifically, the metal sheet 230 is disposed beside the die 120. Other steps of the method according to the second embodiment which are similar to those of the method according to the first embodiment will not be repeatedly described herein.

Third Embodiment

Figure 5:
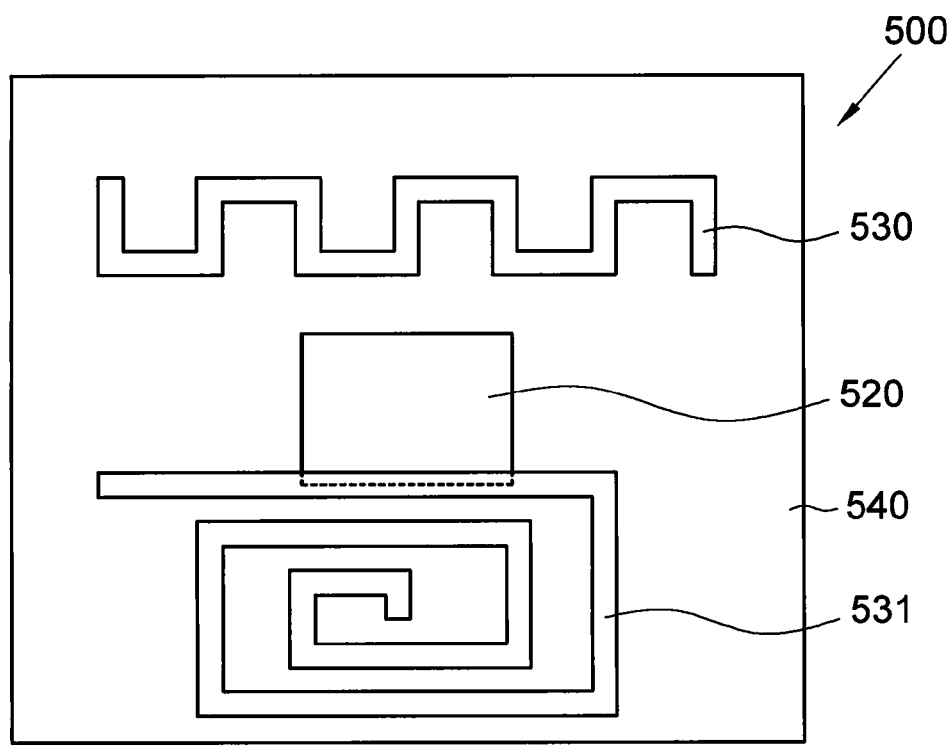
FIG. 5 shows a top view of a semiconductor package according to a third embodiment of the present invention.

Except the semiconductor packages 100 and 200 according to the first embodiment and the second embodiment, a semiconductor package 500 according to another embodiment can have several metal sheets as long as the metal sheets are embedded in the molding compound, as shown in FIG. 5. For example, one metal sheet 530 can be of the S-shaped structure, and another metal sheet 531 can be of the spiral square. The metal sheets 530 and 531 both are disposed beside the die 520 and in the molding compound 540.

Fourth Embodiment

Figure 6:
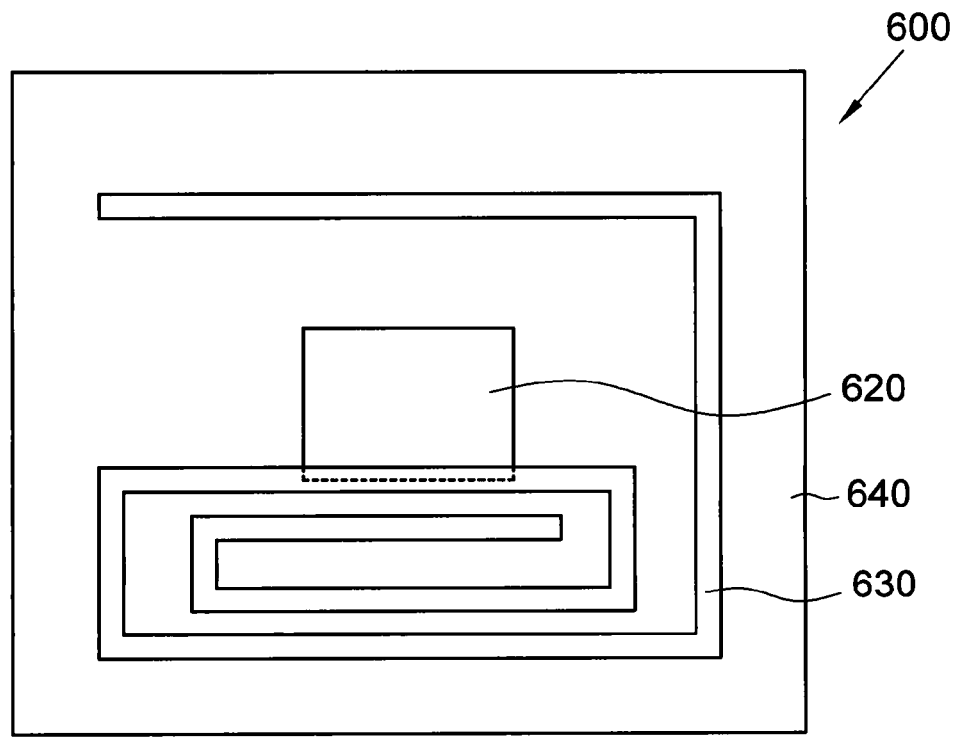
FIG. 6 shows a top view of a semiconductor package according to a fourth embodiment of the present invention.

Referring to FIG. 6, a semiconductor package 600 according to a fourth embodiment of the present invention is shown. The semiconductor package 600 has a metal sheet 630 of the spiral square. The metal sheet 630 is disposed in the molding compound 640. Part of the metal sheet 630 is disposed near one side of the die 620, and another part of the metal sheet 630 is disposed near another side of the die 620.

According to the semiconductor package and the method of manufacturing the same disclosed in the above embodiments of the invention, the metal sheet is embedded in the molding compound, so that size of the carrier is reduced and the size of the semiconductor package is also reduced. Furthermore, the cost of the semiconductor package is lowered.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
   a leadframe having a pad, a surface of the pad is coated with silver;
   a die disposed on the leadframe;
   a metal sheet having a first portion and a second portion, wherein a receiving space is defined by the first portion and the second portion, and an end of the second portion is electrically connected to the pad; and
   a molding compound covering the die and the receiving space is filled by at least part of the molding compound.

2. The semiconductor package according to claim 1, wherein the first portion has a plurality of metal bars, an angle between the two adjacent metal bars is smaller than 180 degrees, and the metal bars are substantially coplanar.

3. The semiconductor package according claim 1, wherein the first portion is a spiral metal bar.

4. The semiconductor package according to claim 1, wherein the first portion is located above the die.

5. The semiconductor package according to claim 1, wherein the metal sheet is disposed on the leadframe and beside the die.

6. The semiconductor package according to claim 1, wherein the first portion is substantially perpendicular to the second portion.

7. The semiconductor package according to claim 1, wherein a distance between the first portion and a top surface of the die is greater than 4 mil.

8. A semiconductor package comprising:
   a substrate having a pad, wherein a plurality of solder balls is disposed on a bottom of the substrate;
   a die disposed on the substrate;
   a metal sheet having a first portion and a second portion, wherein a receiving space is defined by the first portion and the second portion, and an end of the second portion is electrically connected to the pad; and
   a molding compound covering the die and the receiving space is filled by at least part of the molding compound.

9. The semiconductor package according to claim 1, wherein the molding compound covers the metal sheet.

10. A method of manufacturing a semiconductor package, comprising:
    etching part of a metal plate to form a metal sheet having a first portion and a second portion;
    bending the metal plate so that a receiving space is defined by the first portion and the second portion;
    disposing the metal sheet on a carrier having a die disposed thereon and electrically connecting the second portion to the carrier; and
    forming a molding compound to cover the die and fill the receiving space.

11. The method according to claim 10, wherein the first portion has a plurality of metal bars, an angle between the two adjacent metal bars is smaller than 180 degrees, and the metal bars are substantially coplanar.

12. The method according to claim 10, wherein the second portion is substantially perpendicular to the first portion.

13. The method according to claim 10, wherein the carrier has a pad disposed thereon, and in the step of disposing the metal sheet, the metal sheet is disposed to connect one end of the second portion of the metal sheet to the pad.

14. The semiconductor package according to claim 8, wherein the first portion has a plurality of metal bars, an angle between the two adjacent metal bars is smaller than 180 degrees, and the metal bars are substantially coplanar.

15. The semiconductor package according to claim 8, wherein the first portion is a spiral metal bar.

16. The semiconductor package according to claim 8, wherein the first portion is located above the die.

17. The semiconductor package according to claim 8, wherein the metal sheet is disposed on the substrate and beside the die.

18. The semiconductor package according to claim 8, wherein the first portion is substantially perpendicular to the second portion.

19. The semiconductor package according to claim 8, wherein a distance between the first portion and a top surface of the die is greater than 4 mil.

20. The semiconductor package according to claim 8, wherein the molding compound covers the metal sheet.

* * * * *